United States Patent
von Ammon et al.

(10) Patent No.: US 9,005,563 B2
(45) Date of Patent: Apr. 14, 2015

(54) SILICON WAFER AND METHOD FOR PRODUCING IT

(75) Inventors: Wilfried von Ammon, Hochburg (AT); Gudrun Kissinger, Lebus (DE); Dawid Kot, Kunice (PL)

(73) Assignee: Siltronic AG, Munich (DE)

( * ) Notice: Subject to any disclaimer, the term of this patent is extended or adjusted under 35 U.S.C. 154(b) by 878 days.

(21) Appl. No.: 13/191,534

(22) Filed: Jul. 27, 2011

(65) Prior Publication Data

US 2012/0039786 A1     Feb. 16, 2012

(30) Foreign Application Priority Data

Aug. 11, 2010   (DE) .......................... 10 2010 034 002

(51) Int. Cl.
   *C01B 33/02*       (2006.01)
   *F24J 3/00*        (2006.01)
   (Continued)

(52) U.S. Cl.
   CPC ............ *H01L 21/3225* (2013.01); *C30B 29/06* (2013.01); *C30B 33/02* (2013.01)

(58) Field of Classification Search
   CPC ........ C30B 29/06; C30B 33/02; C30B 15/16; C30B 15/206; C30B 13/22; C30B 13/24; H01L 21/322; H01L 21/3221; H01L 21/3225; H01L 21/3226; H01L 29/04; H01L 29/045
   USPC ......... 423/348; 428/212, 446; 117/2, 3, 8, 13, 117/15, 19, 20; 257/62, 607, 617; 438/471, 438/473, 795, 799
   See application file for complete search history.

(56) References Cited

U.S. PATENT DOCUMENTS

| | | | |
|---|---|---|---|
| 5,704,973 A | * | 1/1998 | Sakurada et al. ............... 117/15 |
| 6,336,968 B1 | | 1/2002 | Falster |

(Continued)

FOREIGN PATENT DOCUMENTS

| | | |
|---|---|---|
| CN | 1840749 A | 10/2006 |
| CN | 101160420 A | 4/2008 |

(Continued)

OTHER PUBLICATIONS

Suthar et al, "Estimation of Temperature Distribution in Silicon during Micro Laser Assisted Machining," MSEC_ICM&P2008-72195, Oct. 7-10, 2008, Evanston, IL, USA.*

(Continued)

*Primary Examiner* — Stanley Silverman
*Assistant Examiner* — Kallambella Vijayakumar
(74) *Attorney, Agent, or Firm* — Brooks Kushman P.C.

(57) ABSTRACT

Silicon wafers having an oxygen concentration of $5 \cdot 10^{17}$ to $7.5 \cdot 10^{17}$ cm$^{-3}$ have the following BMD densities after the following thermal processes, carried out alternatively:
- a BMD density of at most $1 \cdot 10^8$ cm$^{-3}$ after a treatment for three hours at 780° C. and subsequently for 16 hours at 1000° C., and
- a BMD density of at least $1 \cdot 10^9$ cm$^{-3}$ after heating of the silicon wafer at a heating rate of 1 K/min from a start temperature of 500° C. to a target temperature of 1000° C. and subsequent holding at 1000° C. for 16 hours. The wafers are prepared by a method of irradiation of a heated wafer with flashlamp which delivers energy which is from 50 to 100% of the energy density necessary for melting the wafer surface.

16 Claims, 2 Drawing Sheets

(51) Int. Cl.
*C30B 33/02* (2006.01)
*C30B 29/06* (2006.01)
*H01L 21/322* (2006.01)

(56) References Cited

U.S. PATENT DOCUMENTS

| | | | |
|---|---|---|---|
| 7,294,196 B2 * | 11/2007 | Sakurada et al. | 117/20 |
| 7,435,294 B2 | 10/2008 | Ono et al. | |
| 7,470,323 B2 * | 12/2008 | von Ammon et al. | 117/19 |
| 7,828,893 B2 | 11/2010 | Mueller et al. | |
| 2004/0097102 A1 * | 5/2004 | Mun et al. | 438/795 |
| 2006/0213424 A1 * | 9/2006 | Mueller et al. | 117/15 |
| 2008/0292523 A1 * | 11/2008 | Ono et al. | 423/348 |
| 2008/0311342 A1 | 12/2008 | Muller et al. | |
| 2009/0103906 A1 | 4/2009 | Kusuda | |
| 2009/0242843 A1 | 10/2009 | Ebara | |

FOREIGN PATENT DOCUMENTS

| | | | |
|---|---|---|---|
| CN | 101423978 A | 5/2009 | |
| EP | 2 144 280 B1 | 1/2010 | |
| EP | 2144280 * | 1/2010 | H01L 21/322 |
| JP | 4-273128 A | 9/1992 | |
| JP | 2002100632 A | 4/2002 | |
| JP | 2008028355 A | 2/2008 | |
| JP | 2010-017811 A | 1/2010 | |
| KR | 10-2008-0031651 | 4/2008 | |
| KR | 10-2009-0129443 | 12/2009 | |
| TW | 200925341 | 5/1997 | |
| WO | 03/095716 A1 | 11/2003 | |

OTHER PUBLICATIONS

Merriam-Webster Dictionary, Incipient, 2014.*
G. Kissinger, A. Sattler, J. Dabrowski, W. von Ammon, "Verification of a Method to Detect Grown-in-Oxide Precipitate Nuclei in Czochralski Silicon," ECS Transactions, 11 (3) 161-171 (2007).

* cited by examiner

SILICON WAFER AND METHOD FOR PRODUCING IT

CROSS-REFERENCE TO RELATED APPLICATIONS

This application claims priority to German Patent Application No. DE 102010034002.2 filed Aug. 11, 2010 which is herein incorporated by reference.

BACKGROUND OF THE INVENTION

1. Field of the Invention

The invention relates to a silicon wafer having a greatly reduced tendency toward oxygen precipitation, and to a method for producing the silicon wafer, the method comprising a thermal treatment.

2. Background Art

Silicon single crystals are usually pulled from a silicon melt situated in a quartz crucible by means of the Czochralski method. As a result of corrosion of the quartz crucible, oxygen passes into the silicon melt, and is incorporated into the crystal in concentrations of a few $10^{17}$ to a few $10^{18}$ cm$^{-3}$ (atoms per cubic centimeter). The oxygen is initially present in dissolved form, but is supersaturated at room temperature and typical temperatures that prevail during the production of electronic circuits and components. Therefore, it precipitates during the production of electronic circuits and components or other thermal treatments at similar temperatures. So-called BMDs arise in the process. These are oxygen agglomerates with or without additional defects which can arise during the thermal treatments directly in the vicinity of the oxygen agglomerates. Nuclei for the BMDs can be formed as early as in the crystal pulling process during the cooling of the single crystal. If the nuclei exceed a temperature-dependent critical size, they are able to grow during a thermal treatment. These BMD nuclei capable of growth are referred to as stable nuclei.

The density of the BMD nuclei cannot be determined directly on account of their small size. In order to measure the density of the stable BMD nuclei, the finished silicon wafer which, however, has not yet been structured in the context of a component process, is usually subjected to a BMD test. This test may consist, for example, in holding the silicon wafer at a temperature of 780° C. for three hours and subsequently at a temperature of 1000° C. for 16 hours. During this thermal treatment, stable BMD nuclei are stabilized further in the first step in order that they can grow to form large detectable BMDs in the second step at 1000° C. within 16 h. Detection takes place after the thermal treatment by means of Secco etch at a fracture edge of a broken silicon wafer in the case of an etching removal of 2.5 μm. This is a customary test for examining the oxygen precipitation behavior of silicon wafers. In another BMD test which is often used, and which leads to similar results, the silicon wafer is held at a temperature of 800° C. for four hours and subsequently at a temperature of 1000° C. for 16 hours.

The stable BMD nuclei that grow to form large BMDs as a result of thermal treatment can impair the functions of the electronic circuits and components by e.g. producing short circuits or reducing the lifetime or the number of the electrical charge carriers within the silicon wafers.

This problem has generally been solved hitherto by means of a thermal treatment that leads to a denuded zone at the surface of the silicon wafer. US2008/0292523A1 describes several methods for producing such a denuded zone. In one case, the silicon wafer is heated to a temperature of above 1000° C. in a short time (a maximum of 100 ms) by means of halogen lamps, xenon flashlamps or a laser and is then rapidly cooled again. The BMD nuclei are thereby eliminated in a thin layer below the surface. Stable BMD nuclei still exist, by contrast, at a depth of greater than 10 μm. After a flashlamp heat treatment for a duration of 1 ms at a maximum temperature of 1250° C., the BMD density within the silicon wafers is $3.8 \cdot 10^6$ cm$^{-2}$ (corresponding to approximately $1.9 \cdot 10^{10}$ cm$^{-3}$), and the thickness of the denuded layer is 0.6 μm. At a maximum temperature of 1300° C., the result is a denuded layer having a thickness of 0.8 μm, and a BMD density of $5.2 \cdot 10^6$ cm$^{-2}$ (corresponding to approximately $2.6 \cdot 10^{10}$ cm$^{-3}$) in the rest of the silicon wafer. The BMD density was measured after a thermal treatment at 800° C. for four hours and subsequently at 1000° C. for 16 hours.

For components for which a short lifetime of the charge carriers within the silicon wafer such as is caused by the BMDs is harmful, silicon wafers having a high BMD density internally and only a thin denuded zone at the surface are unsuitable, however.

Therefore, methods have also been developed which make it possible to free the entire volume of the silicon wafer of BMD nuclei. U.S. Pat. No. 6,336,968B1 describes a method wherein a silicon wafer is heated rapidly to a temperature of at least 1150° C. and remains at this temperature for a number of seconds (at least 1 s) in order to dissolve the pre-existing BMD nuclei. Afterward, the silicon wafer is cooled at a cooling rate of at most 20 K/s to a temperature of a maximum of 950° C. At the maintenance temperature of at least 1150° C., a very high concentration of crystal lattice vacancies arises, these vacancies normally becoming supersaturated during cooling and greatly promoting the origination of new BMD nuclei. By means of the slow cooling, they are intended to be outdiffused beforehand. The same effect can be achieved by keeping the wafer at a constant temperature in the range of 1150 to 950° C. for longer (e.g. >2 s at 1150° C. or >2 min at 950° C.). The reduction of the vacancy supersaturation can be supported by an oxygen-containing atmosphere because the oxidation of the surface generates silicon interstitials (interstitial silicon atoms) which recombine with the vacancies and thus reduce their density further. The problem of this method is that the vacancies bind to oxygen at temperatures below 1150° C. and their outdiffusion is thus made significantly more difficult because the back reactions which liberate the vacancies again require a certain time. The method according to U.S. Pat. No. 6,336,968B1 therefore requires a comparatively long time for processing.

SUMMARY OF THE INVENTION

Therefore, an object of the invention was to formulate an economic method for producing silicon wafers which, despite an oxygen content in the customary range, have a significantly reduced density of stable BMD nuclei in the entire wafer volume. These and other objects are achieved by means of a silicon wafer having an oxygen concentration of $5 \cdot 10^{17}$ to $7.5 \cdot 10^{17}$ cm$^{-3}$, which has the following BMD densities after the following thermal processes, carried out alternatively:

a BMD density of at most $1 \cdot 10^8$ cm$^{-3}$ after a treatment for three hours at 780° C. and subsequently for 16 hours at 1000° C., and a BMD density of at least $1 \cdot 10^9$ cm$^{-3}$ after heating of the silicon wafer at a heating rate of 1 K/min from a start temperature of 500° C. to a target temperature of 1000° C. and subsequent holding at 1000° C. for 16 hours.

DETAILED DESCRIPTION OF THE PREFERRED EMBODIMENT(S)

Figure 1:
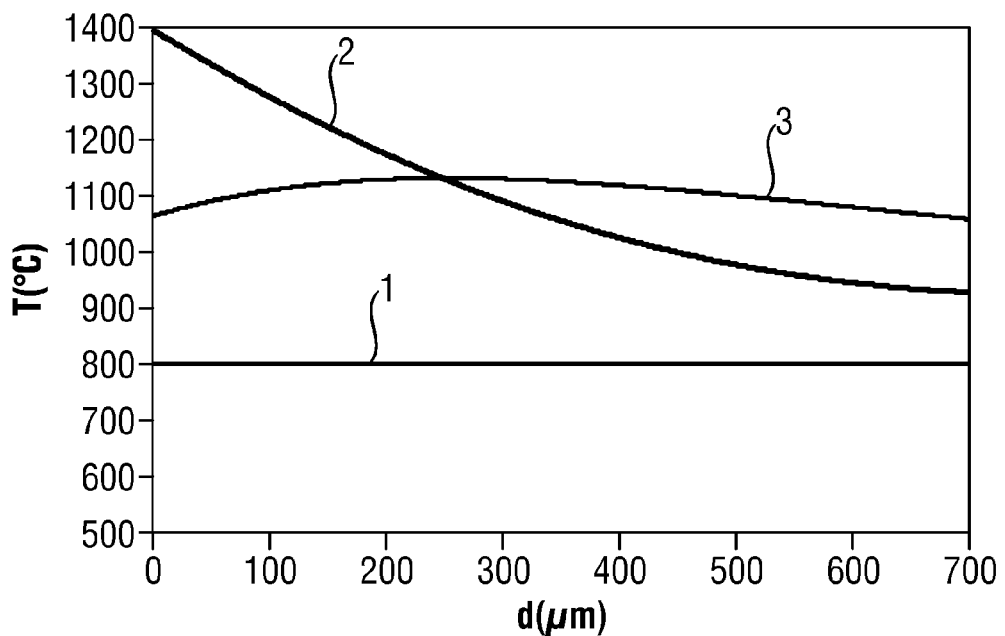
FIG. 1 shows the temperature profile over the thickness of the silicon wafer at two different points in time during the method according to the invention.

All oxygen concentrations in this description should be understood within the meaning of the new ASTM standard (ASTM F121-83).

A silicon wafer of the invention can be produced by means of a method comprising the following steps in the specified order:
a) providing a non-structured silicon wafer having an oxygen concentration of $5 \cdot 10^{17}$ to $7.5 \cdot 10^{17}$ cm$^{-3}$ and a thickness of 0.6 to 1.2 mm,
b) heating the non-structured silicon wafer to a preheating temperature in the range of 600 to 1000° C., and subsequently irradiating a side of the silicon wafer with flashlamp for a duration of 15 to 400 ms, wherein an energy density of 50 to 100% of the energy density necessary for incipiently melting the surface is radiated in.

The method according to the invention, which, owing to the use of a short flash of light, comprises superfast heating to a maximum temperature and superfast cooling immediately afterward, only reduces the size of the BMD nuclei without, however, high vacancy supersaturation being established in the entire wafer volume. Moreover, the vacancies are bound to the oxygen to a significantly lesser extent than in the method described in U.S. Pat. No. 6,336,968B1. The fast heating from one side by means of flashlamp heat treatment for a duration of 15 to 400 ms, preferably 20 to 50 ms, produces a temperature profile in the silicon wafer with the temperature falling from the front side toward the rear side. In this description, front side denotes the side irradiated with the flashlamp. As will be explained later, this is not necessarily the side on which electronic components are subsequently produced. The temperature is so high in the entire volume of the silicon wafer, however, that stable grown-in BMD nuclei shrink. This leads to a supersaturation of the vacancies that falls from the front side toward the rear side, and to an overall lower level of the vacancy concentration after compensation by diffusion during cooling. Thus, according to the invention it is not necessary to outdiffuse the vacancies. Therefore, neither holding times in the temperature range of between 1150 and 950° C. nor the cooling rates of less than or equal to 20 K/s, which are comparatively very low for RTA processes ("Rapid Thermal Anneal"), are necessary according to the invention. It is likewise not necessary to support the reduction of the vacancy concentration by means of an oxidizing atmosphere.

The silicon wafer according to the invention differs from the non-precipitating silicon wafer in accordance with U.S. Pat. No. 6,336,968B1 in that the grown-in BMD nuclei are substantially not dissolved or are only partly dissolved. Rather, they shrink to a size which is smaller than the critical size for their growth in subsequent thermal processes such as the BMD test. The silicon wafer according to the invention with shrunken BMD nuclei is characterized by the fact that it has a very low BMD density following a BMD test. Following a thermal process carried out as an alternative to the BMD test, in which process the silicon wafer is slowly heated to 1000° C. and subsequently held at this temperature for 16 hours, the silicon wafer exhibits, by contrast, a very high BMD density.

Consequently, on account of its very small BMD nuclei, the silicon wafer according to the invention is distinguished by a very different behavior in two different thermal processes. In this case, it should be taken into consideration that these processes are not carried out sequentially, but rather as alternatives. This means that a silicon wafer is either broken into two parts and one part is subjected to the first thermal process and the second part to the second thermal process, in order to ascertain whether a silicon wafer according to the invention is involved. However, it is also possible to use two silicon wafers which have been produced in an identical manner and for this reason have the same properties. These may be, for example, two silicon wafers which originate from two directly adjacent positions on the same silicon single crystal and were processed further in an identical manner. One of the two wafers is subjected to the first process, and the other wafer to the second process, in order to ascertain whether the silicon wafers are silicon wafers according to the invention.

The two thermal processes used for determining the oxygen precipitation properties of silicon wafers according to the invention are described in greater detail below:

Test 1: In order to measure the density of the BMD nuclei, the finished silicon wafer is subjected to a BMD test that includes a thermal treatment at a temperature of 780° C. for a duration of three hours and subsequently at 1000° C. for a duration of 16 hours. The heating and cooling rates are 100 K/min. The entire thermal treatment is carried out under an inert atmosphere. In the first step of this thermal treatment, stable BMD nuclei are stabilized further in order that they can grow to form large detectable BMDs in the second step at 1000° C. within 16 h. This test is a customary BMD test. The BMDs are finally detected in the manner described further below.

Test 2: In order to measure the density of the shrunken BMD nuclei, the finished silicon wafer is heated from an initial temperature of 500° C. at a heating rate of 1 K/min to 1000° C. and subsequently held at this temperature for 16 hours. The entire thermal treatment is carried out under an inert atmosphere. This method can be used to detect small BMD nuclei that are subcritical for the normal BMD test because, on account of the low heating rate of 1 K/min, they can grow precisely so rapidly that their size always remains above the critical radius. The heating rate is simultaneously so high, however, that nuclei that newly arise during heating always remain subcritical because for them the critical radius increases too fast as the temperature increases. The method of operation of this test is described in G. Kissinger, A. Sattler, J. Dabrowski, W. von Ammon, "Verification of a method to detect grown-in oxide precipitate nuclei in Czochralski silicon," ECS Transactions, 11 (3) 161-171 (2007). The holding duration at 1000° C. was lengthened to 16 hours, however, in order to ensure that all BMDs concomitantly grown during the slow heating actually exceed the detection limit, such that they can subsequently be detected. Finally, the BMDs are detected in exactly the same way as in test 1 as described below.

After each of the two tests, the BMDs are detected in the same way by means of a Secco etch on a fractured edge of a silicon wafer broken after the thermal treatment, in the case of an etching removal of 2.5 μm. The Secco etching solution is prepared by dissolving 44 g of potassium dichromate ($K_2Cr_2O_7$) in 1 $dm^3$ of water. This solution is mixed in a ratio of 1:2 with 50% (by weight) hydrofluoric acid (HF in water), (one part potassium dichromate solution with two parts hydrofluoric acid). The etching duration is 3 min, which leads to an etching removal of 2.5 μm at room temperature. The BMDs on the incipiently etched fractured edge are subsequently counted under an optical microscope. In this way, firstly a BMD density relative to the area is determined, which is subsequently converted into a volume density using the etching removal.

The silicon wafer according to the invention with shrunken BMD nuclei is characterized by the fact that it has a BMD density of $1 \cdot 10^6$ $cm^{-3}$ to $1 \cdot 10^8$ $cm^{-3}$, preferably $5 \cdot 10^6$ $cm^{-3}$ to $5 \cdot 10^7$ $cm^{-3}$, in the entire silicon wafer after test 1 described above has been carried out. After test 2, described above, by contrast, this silicon wafer exhibits a BMD density in the range of $1 \cdot 10^9$ $cm^{-3}$ to $5 \cdot 10^{11}$ $cm^{-3}$, and preferably of $1 \cdot 10^{10}$ $cm^{-3}$ to $3 \cdot 10^{11}$ $cm^{-3}$.

The silicon wafer according to the invention does not have a steep rise in the density of the BMD nuclei within the silicon wafer, but rather a very low density of BMD nuclei in the entire wafer volume, in accordance with the BMD test described above as test 1. This density is so low that no denuded zone (DZ) can be discerned.

The method according to the invention for producing a non-precipitating silicon wafer is significantly faster than the method in accordance with U.S. Pat. No. 6,336,968B1.

The silicon wafer produced according to the invention also has the advantage that, in a zone directly below the surface, grown-in defects such as COPs (agglomerates of vacancies), or LPITs (agglomerates of interstitials), which could otherwise impair the component function or the function of electronic circuits, are also dissolved.

Step a) Providing the Wafer

Step a) of the method according to the invention involves producing a silicon wafer having an oxygen concentration of $5 \cdot 10^{17}$ to $7.5 \cdot 10^{17}$ $cm^{-3}$. For this purpose, firstly a silicon single crystal is pulled. This is preferably done using the Czochralski method, since, in this method, oxygen is inevitably incorporated into the single crystal and the problem of oxygen precipitation thus occurs, this problem being solved by the method according to the invention. The single crystal is then sliced into wafers. These silicon wafers can be subjected to further processing steps known in the prior art, such as e.g. edge rounding, grinding, lapping, etching, polishing, edge polishing, or can immediately be subjected to the thermal treatment according to the invention. Preferably, the wafer surfaces should be planarized and the crystal regions damaged by the slicing should be removed before the thermal treatment in step b) is carried out. This can be done by grinding or lapping or a suitable combination thereof. Furthermore, it is expedient for the surface regions damaged by this mechanical processing of the wafer surfaces to be removed by etching before step b) is carried out. Removal of the damaged crystal regions before the thermal treatment is expedient since otherwise dislocations can form during the thermal treatment. Polishing of the wafer surfaces before the thermal treatment is not necessary, but can likewise be carried out.

The methods for producing a silicon single crystal, for slicing the single crystal into wafers and for processing the wafers are known to the person skilled in the art and will therefore not be described in any greater detail.

What is important, however, is that silicon wafers which do not yet bear component structures are subjected to the thermal treatment in step b). These wafers are referred to hereinafter as "non-structured" silicon wafers. It is also known to subject silicon wafers to a thermal treatment by means of flashlamp in the context of fabricating microelectronic components. However, this is done for a totally different purpose, e.g. for electrically activating implanted dopants.

Step b) Thermal Treatment

In step b) the silicon wafer is subjected to a two-stage thermal treatment. The treatment is preferably effected individually in an apparatus equipped with one or more flashlamps. These are generally xenon lamps which are supplied with current in interaction with capacitors and a suitable control for a very short period of time and thereupon emit a flash of light having a duration in the micro- or milliseconds range. Moreover, the apparatus is preferably equipped with a further, separate heating device, which is used for the preheating of the silicon wafer. A suitable apparatus for thermal treatment is described in US2009/0103906A1, for example. As an alternative to the resistance heating described therein, other heating sources such as halogen lamps, as are used in RTA apparatuses, for example, can also be used for preheating the silicon wafer.

The silicon wafer to be treated is transferred into the apparatus for thermal treatment and heated from the start temperature to a first target temperature, which is referred to hereinafter as preheating temperature. The start temperature is the temperature of the silicon wafer after the latter has been transferred into the apparatus for thermal treatment. The preheating temperature is in the range of 600° C. to 1000° C. Preheating to at least 600° C. is necessary in order to prevent the silicon wafer from being damaged or broken during the subsequent flashlamp heat treatment. The upper limit of 1000° C. ensures that a sufficient temperature gradient between the irradiated front side of the silicon wafer and the non-irradiated rear side of the silicon wafer can still be obtained by means of the subsequent momentary irradiation with flashlight. The preheating temperature is preferably chosen in a manner dependent on the thickness of the silicon wafer. Thus, thicker silicon wafers require a higher preheating temperature than thinner silicon wafers in order to be able to obtain the effect according to the invention of the shrinkage of the BMD nuclei with the subsequent flash of light in the entire volume of the silicon wafer. By way of example, a preheating temperature of 600 to 950° C. is suitable for silicon wafers having a thickness of 0.6 to 1.0 mm and a preheating temperature of 700 to 1000° C. is suitable for silicon wafers having a thickness of 1.0 to 1.2 mm.

As described above, the silicon wafer is firstly heated from the start temperature to the preheating temperature by means of resistance heating, by means of lamps (for example halogen lamps) or other heating sources. The heating rate is of no significance for the success of the method according to the invention. However, it should be at least 20 K/min in order to prevent growth of the existing BMD nuclei. For economic reasons, the heating rate should be significantly greater anyway, in order to keep the process duration short. The halogen lamps known from RTA apparatuses permit, for example, heating rates of up to 100 K/s or even more. What is essential to the success of the method according to the invention, however, is that the silicon wafer is heated through completely before being irradiated by the flash of light, that is to say that the entire silicon wafer should have a homogeneous temperature corresponding to the preheating temperature. This requirement is always fulfilled in practice in the case of the customary heating rates of up to 100 K/s.

As soon as the preheating temperature has been reached and the temperature in the silicon wafer is homogeneous, the flashlamps emit a flash of light for a duration of 15 to 400 ms, preferably of 20 to 50 ms. In this case, an energy density is radiated in which corresponds to 50 to 100%, preferably 90 to 100%, of the energy density necessary for incipiently melting the surface.

According to the invention, only one side of the silicon wafer is irradiated with the flashlamp. This side is referred to here as "front side". This can be the side which is provided for the subsequent production of components. This embodiment is preferred since possible impressions or other damage caused by the wafer support (susceptor, pins) in this case arise on the side not provided for the production of components, where they cause less disturbance.

The energy density necessary for incipiently melting the surface is dependent on the preheating temperature, the thickness of the silicon wafer, the reflectivity of the surface thereof (that is to say the surface constitution) and the duration of the flash of light. This can be determined by a simple series of experiments in which the energy density varies and all of the other parameters mentioned above are kept constant. Incipient melting of the surface can be ascertained by optical inspection of the surface after flashlamp heat treatment has taken place. Incipient melting brings about a haze of the polishing in the case of polished surfaces, associated with geometrical-structural alterations of the smooth surface. In the case of rough surfaces, too, the incipient melting brings about a geometrical-structural alteration of the surface structure.

If the energy density necessary for incipiently melting the surface is determined for a set of parameters, then it is possible to choose the energy density of the flash of light in the range according to the invention of 50 to 100% of this value. A sufficiently high temperature for the shrinkage of the BMD nuclei and a sufficiently large temperature gradient between front side and rear side are ensured in this range. The flash heats the front side of the silicon wafer to a maximum temperature lying in the range of from 1100° C. to the melting point of silicon. A maximum temperature just below the melting point of silicon is particularly preferred, which is achieved by means of an energy density of 90 to 100% of the energy density necessary for incipiently melting the surface. If the temperature lies above the melting point, the surface of the silicon wafer is slightly incipiently melted, which can lead to dislocations arising below the incipiently melted region. Therefore, it is particularly preferred to radiate in an energy density of <100% of the energy density necessary for incipiently melting the surface. As long as this requirement is met, the energy density should, however, be chosen to be as high as possible.

It is also possible for a plurality of flashes of light to be emitted in succession, in which case the maximum temperature of the wafer front side should again lie just below the melting point of silicon.

The heating of the front side to the maximum temperature and the subsequent cooling, in each case by hundreds of degrees, take place in the time period of milliseconds. This means that the heating and cooling rates of the wafer front side are a number of orders of magnitude greater than in the case of an RTA treatment as described in U.S. Pat. No. 6,336,968B1, for example. The maintenance time at the maximum temperature is, according to the invention, significantly shorter than the maintenance time in RTA processes, which is in the range of above one second in accordance with U.S. Pat. No. 6,336,968B1.

What is essential to the success of the method according to the invention is the duration of the flash of light. In this context, the "duration of the flash of light" should be understood to mean its full width at half maximum. Thus, in the case of a duration of less than 15 ms, the size the BMD nuclei cannot be reduced in the entire volume of the silicon wafer in such a way that BMDs no longer form during a customary BMD test (e.g. during test 1 described above). What is essential, on the one hand, is that the flash of light lasts long enough for the entire thickness of the silicon wafer to be subjected to a significant temperature increase, even if the latter is of varying magnitude depending on the distance from the irradiated surface. On the other hand, the flash of light is not permitted to last too long, since this would lead to the silicon wafer being heated through completely, that is to say to the disappearance of the temperature gradient between front and rear sides which is necessary according to the invention. This requirement is fulfilled up to a duration of a maximum of 400 ms. Under these conditions and in conjunction with the above-described energy density according to the invention of the flash of light, on the one hand the entire volume of the silicon wafer is momentarily brought to a temperature sufficient for the shrinkage of the BMD nuclei. On the other hand, the temperature gradient that arises when the flash takes effect (that is to say the lower temperature on the wafer rear side) ensures that the vacancy supersaturation on average remains significantly lower than would the case in the event of complete heating of the wafer to temperatures close to the melting point. Moreover, the temperature gradient also ensures that the silicon wafer cools very rapidly again after the flash of light. This prevents stable BMD nuclei from forming anew again during cooling, as can happen for example during the comparatively slow cooling in accordance with U.S. Pat. No. 6,336,968B1.

The temperature profile over the thickness of the silicon wafer at different points in time after the action of the flash of light is illustrated with reference to FIGS. 1 and 2.

FIG. 1 shows two modeled temperature profiles in a 700 μm thick silicon wafer at different points in time during a thermal treatment carried out according to the invention with a flashlamp. For this purpose, the heat conduction equation was used under the boundary conditions that, before the flash, the temperature in the entire silicon wafer is equal to the preheating temperature and that the temperature on the side facing the flashlamp rises up to the maximum temperature and decreases again in accordance with a Gaussian curve with the corresponding full width at half maximum (flash duration). Curve 1 shows the temperature profile over the thickness of the silicon wafer after end of the preheating phase and before the flash of light. The entire thickness of the silicon wafer is uniformly at a temperature of, in this case, 800° C. On account of the flash of light with an intensity profile corresponding to the Gaussian normal distribution and a full width at half maximum of 20 ms, a maximum temperature of 1400° C. is achieved on the front side of the silicon wafer. Curve 2 shows the temperature distribution over the thickness of the silicon wafer at the point in time of the attainment of the maximum temperature on the wafer front side. As a result of heat conduction within the silicon wafer, as a result of emission from the surface and also as a result of heat conduction of the surrounding atmosphere, cooling and simultaneous redistribution of the temperature subsequently occur. Curve 3 shows the temperature distribution at the later point in time at which the temperature at the rear side of the silicon wafer has reached its maximum.

Figure 2:
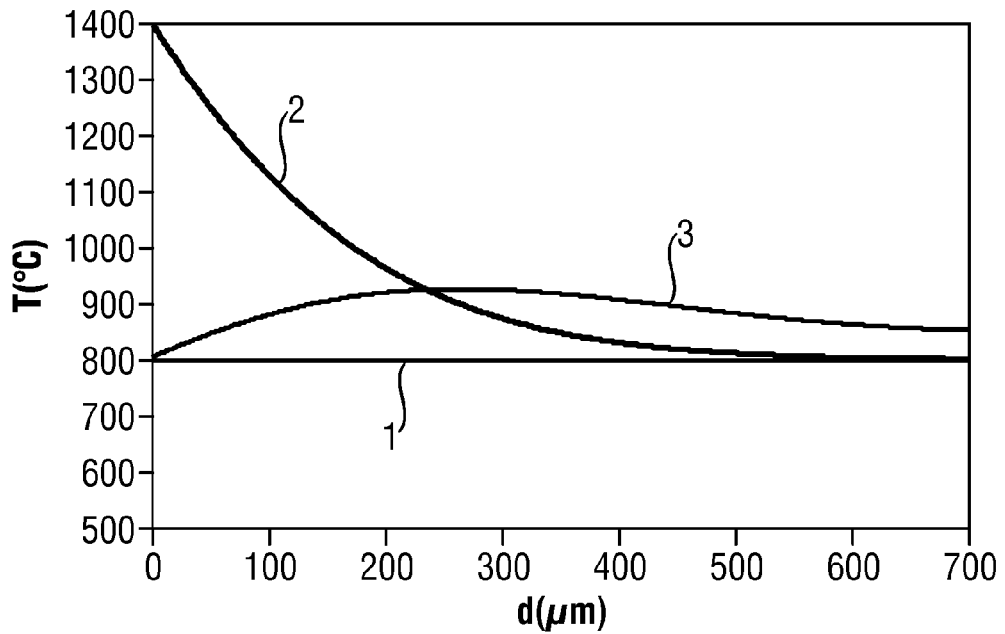
FIG. 2 shows for comparison the temperature profile over the thickness of the silicon wafer at two different points in time during a method not according to the invention, with a shorter flash duration.

In comparison therewith, FIG. 2 shows the corresponding modeled temperature profiles for a flash of light not according to the invention, with a full width at half maximum of 3 ms.

It can clearly be seen that, in the case of an implementation according to the invention with a full width at half maximum of the flash of light of 20 ms (see FIG. 1), the temperature in the entire silicon wafer distinctly rises above the preheating temperature, while in the case of a treatment carried out not according to the invention, with a full width at half maximum of the flash of light of 3 ms (FIG. 2), on the wafer rear side, the temperature rises only little and remains below 1000° C. even though the front side reaches 1400° C. The consequence of this is that, with the same maximum temperature, it is only in the case of a sufficiently high full width at half maximum of the flash of light that the BMD nuclei within the silicon wafer and at the rear side of the silicon wafer also shrink. According to the invention, the preheating temperature, the duration of the flash of light and the maximum temperature are chosen so as to ensure that the BMD nuclei also shrink sufficiently within the silicon wafer and at the rear side of the silicon wafer. As a result, not only does a denuded zone (DZ) arise at the wafer front side, but also the tendency toward oxygen precipitation in the entire wafer volume is distinctly reduced.

Step c) Edge Processing

After the thermal treatment, the silicon wafer is processed further in the manner known from the prior art. By way of example, after the thermal treatment, single- or multistage polishing of both sides or only of the front side can additionally be effected.

It is known that thermal processes with superfast heating to a maximum temperature and subsequent superfast cooling can lead to slip on the silicon wafer. The slip can spread further in subsequent thermal processes in circuit and component production and disturb or nullify the function of the circuits and components. This slip occurs primarily in the edge region of the silicon wafer.

Owing to the very short overall process duration of the thermal treatment according to the invention, the edge slip is very short. Therefore, the zone at the edge of the silicon wafer in which edge slip occurs is only very narrow. Therefore, it can be removed without great losses. The width of the region to be removed is preferably 1 to 5 mm, and particularly preferably 2 to 3 mm. It is preferred, therefore, after the thermal treatment, to mechanically process the edge of the silicon wafer in an additional step c) in order to remove the outermost edge of the silicon wafer where the slip is situated.

Any known methods for the edge processing of silicon wafers, in particular methods which simultaneously impart a defined profile to the edge of the silicon wafer (so-called edge rounding), are suitable for this purpose. This is generally effected by grinding the wafer edge. A profile grinding disk is usually used for this purpose, the disk copying its negative profile positively onto the wafer edge. However, it is also possible to use non-profiled grinding tools such as e.g. abrasive pads. If the edge processing is carried out as step c) after the thermal treatment in accordance with step b), the edge rounding before the thermal treatment is preferably omitted.

By means of the mechanical processing of the wafer edge, the radius of the silicon wafer is reduced by a value which is preferably at least of the same magnitude as the width of the region affected by the edge slip. After the mechanical edge processing for removing the regions affected by slip, the edge can preferably be polished.

If the material removal required in optional step c) is so great that, as a result, the diameter of the finished processed silicon wafer would fall below the nominal diameter thereof, this can already have been taken into account in the production of the single crystal. The latter can be pulled with a diameter which lies above the nominal diameter of the silicon wafers to be produced therefrom at least by a value corresponding to the width of the slip region that arises in step b). In this case, the silicon wafers have a diameter greater than the nominal diameter during the thermal treatment in step b). It is only as a result of the edge processing in step c) that the diameter of the silicon wafers is reduced to the nominal diameter.

The correspondingly produced silicon wafer, in addition to the above-described properties with regard to oxygen precipitation, is free of edge slip. This can be verified by means of SIRD (Scanning Infrared Depolarization).

If the edge slip is not a disturbance, it does not have to be removed, or does not have to be completely removed.

Examples and Comparative Examples

Example 1

A silicon single crystal doped with boron was produced by means of the Czochralski method. The silicon single crystal was sawn into wafers, lapped, etched and polished. The resulting silicon wafers had a thickness of 725 μm, a resistivity of approximately 10 Ωcm and an oxygen concentration as indicated in Table 1.

The silicon wafers (apart from comparative sample No. 11/3) were subjected to a thermal treatment according to the invention. In this case, the silicon wafers were preheated to 800° C. within two minutes. Directly after the preheating temperature had been attained, the flash of light from a xenon lamp with a full width at half maximum of 20 ms was triggered and the wafer front side thereby irradiated. The energy density of the flash was varied, wherein the surface of the silicon wafer began to melt at an energy density of more than 97.5 J/m$^2$.

Test 1 described above was then carried out as a BMD test and the BMD density was then determined in the manner described above.

TABLE 1

| Sample No. | Energy density (J/m$^2$) | Flash duration (ms) | BMD density (cm$^{-3}$) | BMD density (cm$^{-2}$) | Oxygen content (10$^{17}$ cm$^{-3}$) |
|---|---|---|---|---|---|
| 11/3 | — | — | 3.0E+09 | 7.4E+05 | 7.1 |
| 20/2 | 85 | 20 | 4.6E+07 | 1.1E+04 | 7.1 |
| 22/3 | 85 | 20 | 2.0E+07 | 5.1E+03 | 7.1 |
| 23/1 | 85 | 20 | 1.8E+07 | 4.4E+03 | 7.1 |
| 23/3 | 85 | 20 | 2.8E+07 | 6.9E+03 | 7.1 |
| 22/4 | 85 | 20 | 2.3E+07 | 5.7E+03 | 7.1 |
| 23/2 | 85 | 20 | 1.5E+07 | 3.8E+03 | 7.1 |
| 20/3 | 90 | 20 | 2.2E+07 | 5.5E+03 | 7.1 |
| 24/1 | 90 | 20 | 1.4E+07 | 3.5E+03 | 6.9 |
| 20/4 | 95 | 20 | 9.1E+06 | 2.3E+03 | 7.1 |
| 24/2 | 95 | 20 | 2.0E+07 | 4.9E+03 | 6.9 |
| 21/3 | 97.5 | 20 | 9.1E+06 | 2.3E+03 | 6.9 |
| 21/1 | 97.5 | 20 | 7.6E+06 | 1.9E+03 | 6.9 |
| 22/1 | 97.5 | 20 | 2.0E+07 | 5.1E+03 | 7.1 |
| 21/4 | 97.5 | 20 | 2.3E+07 | 5.7E+03 | 6.9 |
| 22/2 | 97.5 | 20 | 1.0E+07 | 2.5E+03 | 7.1 |
| 24/3 | 97.5 | 20 | 1.2E+07 | 3.0E+03 | 6.9 |
| 21/2 | 100 | 20 | 1.0E+07 | 2.5E+03 | 6.9 |

Table 1 shows that after test 1 the BMD density of the silicon wafer (No. 11/3) not subjected to thermal treatment is 3.0·10$^9$ cm$^{-3}$. By contrast, the BMD density was reduced by the thermal treatment according to the invention to less than 5·10$^7$ cm$^{-3}$ in the entire volume of the silicon wafer. The lowest BMD densities are achieved with the highest energy densities of the flash of light, that is to say when the maximum temperature of the wafer front side is as close as possible to the melting point of silicon. In all cases the BMD density is so low that no denuded zone (DZ) can be ascertained.

Figure 3:
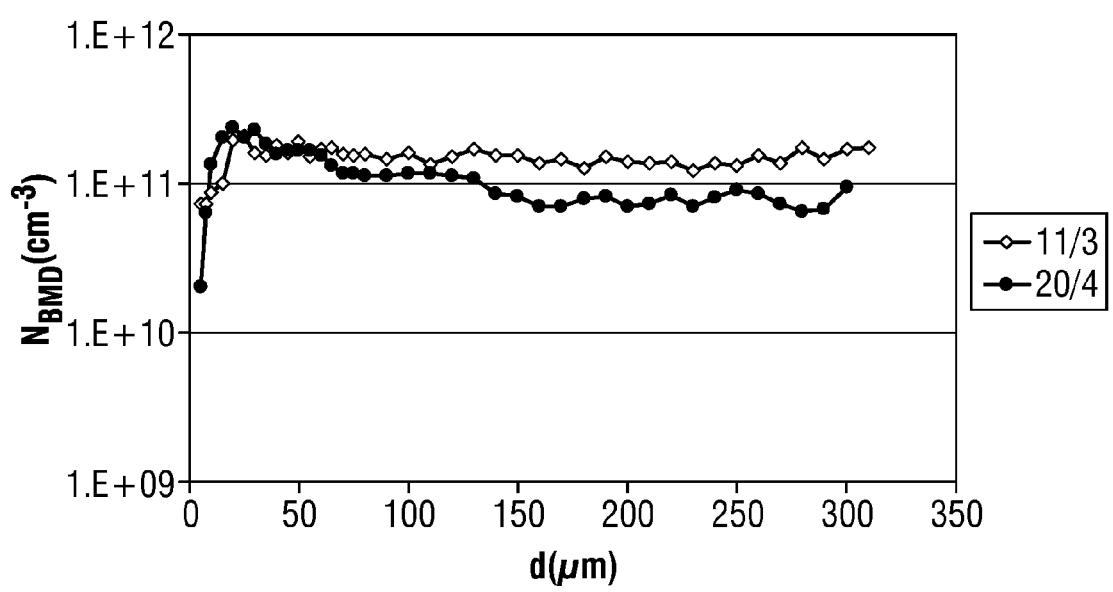
FIG. 3 shows the depth dependence of the BMD density of a silicon wafer according to the invention in comparison with a silicon wafer not subjected to thermal treatment, after test 2 was carried out.

A further silicon wafer from the set of wafers subjected to thermal treatment according to the invention (corresponding to sample No. 20/4 in accordance with Table 1) and also a further silicon wafer not subjected to thermal treatment (corresponding to sample No. 11/3) were subjected to test 2 described above, instead of test 1. After test 2, the silicon wafer 20/4 subjected to thermal treatment according to the invention exhibited a BMD density of approximately $10^{11}$ cm$^{-3}$, as can be seen in FIG. 3. FIG. 3 shows the depth dependence of the BMD density after test 2. After test 2, the silicon wafer 11/3 not subjected to thermal treatment had a BMD density of somewhat more than $10^{11}$ cm$^{-3}$. After test 2, therefore, no appreciable difference in the BMD densities of the silicon wafer subjected to thermal treatment according to the invention and the silicon wafer not subjected to thermal treatment can be ascertained even through the BMD densities after test 1 (see Table 1) differ distinctly. This shows that the BMD nuclei only shrank on account of the thermal treatment according to the invention and can be made visible again under the particular conditions of test 2.

Comparative Example 1

Silicon wafers were produced in the same way as in accordance with Example 1 and (with the exception of sample No. 11/3) were subjected to a thermal treatment. The thermal treatment differed from the thermal treatment in accordance with Example 1 only in that the full width at half maximum of the flash of light was 3 ms. The energy density of the flash was varied, wherein the surface of the silicon wafer began to melt at an energy density of more than 52.5 J/m$^2$.

Table 2 shows that after test 1 the BMD density of the silicon wafer not subjected to thermal treatment is $3.0 \cdot 10^9$ cm$^{-3}$. In the silicon wafers subjected to thermal treatment, the BMD density was reduced in the volume of the silicon wafers only to less than $1 \cdot 10^9$ cm$^{-3}$. It was not possible to achieve BMD densities of less than $2 \cdot 10^8$ cm$^{-3}$. A denuded zone (DZ) having a depth indicated in Table 2 was able to be detected below the surface on the side irradiated with the flash of light. The depth of the DZ increased with the energy density of the flash of light. This comparative example shows that it is not possible to achieve the desired effect with a short flashlamp heat treatment in accordance with the prior art. A silicon wafer having a denuded zone at the surface and a high BMD density in the volume of the silicon wafer arises instead.

TABLE 2

| Sample No. | Energy density (J/m$^2$) | Flash duration (ms) | BMD density (cm$^3$) | BMD density (cm$^{-2}$) | Oxygen content ($10^{17}$ cm$^{-3}$) | DZ (µm) |
|---|---|---|---|---|---|---|
| 11/3 | — | — | 3.0E+09 | 7.4E+05 | 7.1 | — |
| 24/4 | 39 | 3 | 6.1E+08 | 1.5E+05 | 6.9 | 65 |
| 25/1 | 45 | 3 | 9.9E+08 | 2.5E+05 | 7.0 | 62 |
| 25/3 | 50 | 3 | 2.3E+08 | 5.8E+04 | 7.0 | 92 |
| 25/4 | 52.5 | 3 | 5.9E+08 | 1.5E+05 | 7.0 | 123 |
| 25/2 | 55 | 3 | 9.3E+08 | 2.3E+05 | 7.0 | 123 |

Example 2

A silicon single crystal doped with boron was produced by means of the Czochralski method. The silicon single crystal was sawn into wafers, lapped and etched, but—in contrast to Example 1—not polished. The resulting silicon wafers had a thickness of 680 µm, a resistivity of approximately 10 Ωcm and an oxygen concentration of $6.9 \cdot 10^{17}$ cm$^{-3}$.

The silicon wafers were subsequently subjected to a thermal treatment in accordance with Example 1. The energy density of the flash was varied, wherein the surface of the silicon wafer began to melt at an energy density of more than 97.5 J/m$^2$.

TABLE 3

| Sample No. | Energy density (J/m$^2$) | Flash duration (ms) | BMD density (cm$^{-3}$) | BMD density (cm$^{-2}$) | Surface |
|---|---|---|---|---|---|
| S3 | 95 | 20 | 6.1E+07 | 1.5E+04 | etched |
| S4 | 100 | 20 | 5.1E+06 | 1.3E+03 | etched |

Example 2 shows that the method according to the invention is also successful in the case of non-polished silicon wafers.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A silicon wafer having an oxygen concentration of $5 \cdot 10^{17}$ to $7.5 \cdot 10^{17}$ cm$^{-3}$, and having a BMD density, wherein
    the BMD density is at most $1 \cdot 10^8$ cm$^{-3}$, measured after treating the silicon wafer for three hours at 780° C. and subsequently for 16 hours at 1000° C., and
    the BMD density at least $1 \cdot 10^9$ cm$^{-3}$, measured after treating the silicon wafer at a heating rate of 1 K/min from a start temperature of 500° C. to a target temperature of 1000° C. and at 1000° C. for 16 hours.

2. The silicon wafer of claim 1, wherein the BMD density is from $5 \cdot 10^6$ cm$^{-3}$ to $5 \cdot 10^7$ cm$^{-3}$, measured after treating the silicon wafer for three hours at 780° C. and subsequently for 16 hours at 1000° C.

3. The silicon wafer of claim 1, wherein the BMD density is from $1 \cdot 10^{10}$ cm$^{-3}$ to $3 \cdot 10^{11}$ cm$^{-3}$, measured after treating the silicon wafer at a heating rate of 1 K/min from the start temperature of 500° C. to the target temperature of 1000° C. and at 1000° C. for 16 hours.

4. A method for producing a silicon wafer of claim 1, the method comprising the following steps in the specified order:
    a) providing a non-structured silicon wafer having an oxygen concentration of $5 \cdot 10^{17}$ to $7.5 \cdot 10^{17}$ cm$^{-3}$ and a thickness of 0.6 to 1.2 mm,
    b) heating the non-structured silicon wafer to a preheating temperature in the range of 600 to 1000° C., and subsequently irradiating a side of the silicon wafer with a flashlamp for a duration of 15 to 400 ms, wherein an energy density of 50 to 100% of the energy density necessary for incipiently melting the surface is radiated in.

5. The method of claim 4, wherein the thickness of the silicon wafer is 0.6 to 1.0 mm and the preheating temperature in step b) is 600 to 950° C.

6. The method as claimed in claim 4, wherein the thickness of the silicon wafer is 1.0 to 1.2 mm and the preheating temperature in step b) is 700 to 1000° C.

7. The method of claim 4, wherein the energy density radiated in is 90 to 100% of the energy density necessary for incipiently melting the surface.

8. The method of claim 5, wherein the energy density radiated in is 90 to 100% of the energy density necessary for incipiently melting the surface.

9. The method of claim 6, wherein the energy density radiated in is 90 to 100% of the energy density necessary for incipiently melting the surface.

10. The method of claim 4, wherein, after step b), the edge of the silicon wafer is processed in material-removing fashion in a further step c), wherein the material removal is a maximum of 5 mm.

11. The method of claim 5, wherein, after step b), the edge of the silicon wafer is processed in material-removing fashion in a further step c), wherein the material removal is a maximum of 5 mm.

12. The method of claim 6, wherein, after step b), the edge of the silicon wafer is processed in material-removing fashion in a further step c), wherein the material removal is a maximum of 5 mm.

13. The method of claim 7, wherein, after step b), the edge of the silicon wafer is processed in material-removing fashion in a further step c), wherein the material removal is a maximum of 5 mm.

14. The method of claim 8, wherein, after step b), the edge of the silicon wafer is processed in material-removing fashion in a further step c), wherein the material removal is a maximum of 5 mm.

15. The method of claim 9, wherein, after step b), the edge of the silicon wafer is processed in material-removing fashion in a further step c), wherein the material removal is a maximum of 5 mm.

16. The method of claim 10, wherein material removed from the edge of the silicon wafer contained edge slips created in the method.

* * * * *

UNITED STATES PATENT AND TRADEMARK OFFICE
CERTIFICATE OF CORRECTION

PATENT NO. : 9,005,563 B2  
APPLICATION NO. : 13/191534  
DATED : April 14, 2015  
INVENTOR(S) : von Ammon et al.

Page 1 of 1

It is certified that error appears in the above-identified patent and that said Letters Patent is hereby corrected as shown below:

In the Claims,

Column 12, Line 31, Claim 1:

After "the BMD density"  
Insert -- is --.

Signed and Sealed this  
Eleventh Day of August, 2015

Michelle K. Lee  
*Director of the United States Patent and Trademark Office*